US007351294B2

(12) United States Patent
Murrer et al.

(10) Patent No.: US 7,351,294 B2
(45) Date of Patent: Apr. 1, 2008

(54) SURFACE CLEANER

(75) Inventors: Barry Anthony Murrer, Berkshire (GB); Robert J. Potter, Reading (GB); Virginie Ogrodnik, Henley on Thames (GB)

(73) Assignee: Reckitt Benckiser (UK) Limited, Berkshire (GB)

( * ) Notice: Subject to any disclaimer, the term of this patent is extended or adjusted under 35 U.S.C. 154(b) by 0 days.

(21) Appl. No.: 11/513,783

(22) Filed: Aug. 31, 2006

(65) Prior Publication Data

US 2006/0289035 A1 Dec. 28, 2006

Related U.S. Application Data

(62) Division of application No. 10/168,933, filed as application No. PCT/IB00/01950 on Dec. 22, 2000, now abandoned.

(30) Foreign Application Priority Data

Dec. 22, 1999 (GB) ................................ 9930248.1

(51) Int. Cl.
*G03F 7/42* (2006.01)
*C23G 1/00* (2006.01)

(52) U.S. Cl. ........................ 134/2; 430/270.1; 430/447

(58) Field of Classification Search ............. 430/270.1, 430/447
See application file for complete search history.

(56) References Cited

U.S. PATENT DOCUMENTS

| | | | | |
|---|---|---|---|---|
| 4,338,291 | A * | 7/1982 | Yamada et al. | 423/648.1 |
| 4,731,194 | A | 3/1988 | Rossmann et al. | |
| 5,292,409 | A | 3/1994 | Dixon et al. | |
| 5,376,288 | A | 12/1994 | Falholt et al. | |
| 6,413,924 | B2 * | 7/2002 | Willey | 510/301 |
| 6,417,150 | B2 * | 7/2002 | Willey | 510/301 |
| 6,664,462 | B2 | 12/2003 | Arakawa et al. | |
| 2006/0019853 | A1 * | 1/2006 | Wieprecht et al. | 510/367 |

FOREIGN PATENT DOCUMENTS

| | | | |
|---|---|---|---|
| FR | 2 729 673 | A1 | 7/1996 |
| GB | 1 372 035 | | 10/1974 |
| GB | 1 412 937 | | 11/1975 |
| JP | 9-235596 | | 9/1997 |
| WO | WO-94/04497 | A1 | 3/1994 |
| WO | WO-95/29924 | A1 | 11/1995 |
| WO | WO-96/23051 | A1 | 8/1996 |
| WO | WO-98/32829 | A2 | 7/1998 |

OTHER PUBLICATIONS

J. DeSilvestro, "Highly efficient sensitization of titanium dioxide," *Journal of the American Chemical Society*, vol. 107, No. 10, 1985, pp. 2988-2990.

(Continued)

*Primary Examiner*—Amanda Walke
(74) *Attorney, Agent, or Firm*—RatnerPrestia

(57) ABSTRACT

The present invention relates to methods of use for photocatalytic cleaning compositions and photocatalytic cleaning compositions effective to degrade soils deposited on a surface, to reduce the accumulation of soils on a surface, and to act as an antimicrobial agent.

15 Claims, 7 Drawing Sheets

OTHER PUBLICATIONS

Figure 1:
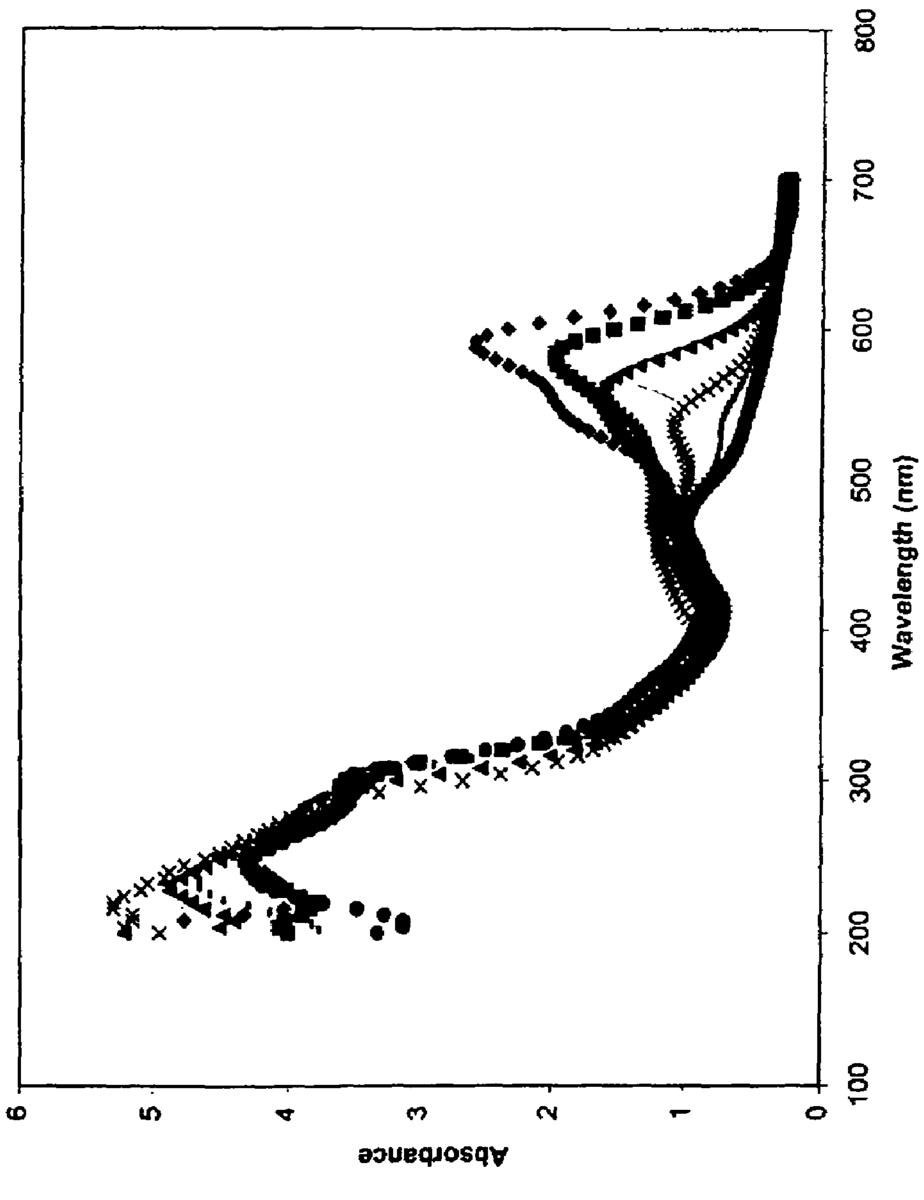

David F. Ollis, Ezio Pelizzetti, and Nick Serpone, "Photocatalyzed destruction of water contaminants," *Environmental Science and Technology*, vol. 25, 1991, pp. 1522-1529.
Adam Heller, "Chemistry and Applications of Photocatalytic Oxidation of Thin Organic Films," *Accounts of Chemical Research*, vol. 28, 1995, pp. 503-508.
Hiroyuki Osora, Li Weijin, Luis Otero and Marye Anne Fox, "Photosensitization of nanocrystalline $TiO_2$ thin films by a polyimide bearing pendent substituted-$Ru(bpy)_3^{+2}$ groups," *Journal of Photochemistry and Photobiology B: Biology*, vol. 43, No. 3, Jun. 1998, pp. 232-238.
Brian R. James and Piet W.N.M. van Leeuwen, *Catalysis by Metal Complexes*, vol. 14: *Photosensitization and Photocatalysis Using Inorganic Organometallic Compounds*, M. Grätzel and K. Kalyanasundaram, Eds. (Dordect: Kluwer Academic Publishers, 1993), pp. 247-271.
B. O'Regan and M. Grätzel, "A Low-Cost, High-Efficiency Solar Cell Based on Dye-Sensitized Colloidal $TiO_2$ Films," *Nature*, vol. 353, 1991, pp. 737-739.
J. Lobedank, E. Bellmann and J. Bendig, "Sensitized photocatalytic oxidation of herbicides using natural sunlight," *Journal of Photochemistry and Photobiology A: Chemistry*, vol. 108, No. 1, Jul. 31, 1997, pp. 89-93.
Claudius Kormann, Detlef W. Bahnemann and Michael R. Hoffmann, "Preparation and characterization of quantum-size titanium dioxide," *Journal of Physical Chemistry*, vol. 92, No. 18, 1988, pp. 5196-5201.
Detlef W. Bahnemann, Joerg Moenig and Rita Chapman. "Efficient photocatalysis of the irreversible one-electron and two-electron reduction of halothane on platinized colloidal titanium dioxide in aqueous suspension" *Journal of Physical Chemistry*, vol. 91, No. 14, 1987, pp. 3782-3788.
R. F. Evans, M. Van Ammers, and H. J. Den Hertog, "A New Synthesis of 2,6-Dibromopyridine-N-Oxide," *Recl. Trav. Chim. Pays. Bas*, 1959, vol. 78, p. 408-411.
W. R. McWhinnie, R. C. Poller and M. Thevarasa, "An inclusion compound from hexaphenylditin and tetraphenyltin," *Journal of Organometallic Chemistry*, vol. 11, 1968, pp. 499-502.
Edwin C. Constable and Alexander M. W. Cargill Thompson, "Ligand Reactivity in Iron (II) Complexes of 4'-(4'''-Pyridyl)-2,2':6',2"-terpyridine," *J. Soc. Dalton Trans.*, 1992, p. 2947.
Kevin T. Potts, Douglas A. Usifer, Ana Guadalupe and Hector D. Abruna, 4-Vinyl-, 6-vinyl-, and 4'-vinyl-2,2':6',2"-terpyridinyl ligands: their synthesis and the electrochemistry of their transition-metal coordination complexes, Journal of *the American Chemical Society*, vol. 109, No. 13, 1987, pp. 3961-3967.
Robert H. Dodd and Mireille Le Hyaric, "The Oxidation of Aromatic Aldehydes to Carboxylic Acids Using Hydrogen Peroxide in Formic Acid," *Synthesis* (1993), vol. 3, p. 295).
Andrew Williams and Ibrahim T. Ibrahim, "Carbodiimide Chemistry: Recent Advances," *Chemical Reviews*, vol. 81, No. 6, 1981, pp. 589-636.
Seymour L. Shapiro, Harold Soloway, and Louis Freedman, "Antihypertensive Agents. I. Dialkylaminoalkoxyalkylpiperidines and Pyrrolidines," *Journal of the American Chemical Society*, vol. 80, No. 11, 1958, pp. 2743-2745.
Koji Araki, Toshiki Mutai, Yasuhiro Shigemitsu, Masaki Yamada, Takayoshi Nakajima, Shigeyasu Kuroda and Ichiro Shimao, "6-Amino-2,2'-bipyridine as a new fluorescent organic compound" *Journal of the Chemical Society, Perkin Transactions 2*, vol. 4, 1996, pp. 613.
John P. Wolfe, Hiroshi Tomori, Joseph P. Sadighi, Jingjun Yin and Stephen L. Buchwald, "Simple, Efficient Catalyst System for the Palladium-Catalyzed Amination of Aryl Chlorides, Bromides, and Triflates," *The Journal of Organic Chemistry*, vol. 65, No. 4, 2000, pp. 1158-1174.
E. A. Seddon and K. R. Seddon, *Topics in Inorganic and General Chemistry*, vol. 19: *The Chemistry of Ruthenium*, P. L. Robinson, Ed., (New York: Elsevior Science Publishing Co. Inc., 1984) pp. 436.

* cited by examiner

SURFACE CLEANER

This application is a divisional application of U.S. patent application Ser. No. 10/168,933, filed Nov. 5, 2002 now abandoned, which is the U.S. National Phase application of International Application No. PCT/IB00/001950, filed Dec. 22, 2000, and claims priority of British Patent Application No. 9930248.1, filed Dec. 22, 1999. These three applications are incorporated herein by reference.

The present invention relates to sensitising agents and compositions effective to degrade soils deposited on a surface, methods employing said agents and compositions, and uses thereof.

Cleaning compositions intended for general and specific uses are well known in the art. Such compositions will normally comprise one or more surfactants, solvents, thickening agents, abrasive particles and colouring agents. Although these compositions are effective at removing soils, inevitably resoiling occurs after cleaning and thus recleaning is required.

A means to reduce the frequency of cleaning and recleaning would thus be advantageous. In addition it would be beneficial if one could reduce the rate of accumulation of surface soils in the first instance. The present invention seeks to address these problems.

The photocatalysed degradation of organic environmental pollutants in the presence of a semiconductor such as titanium dioxide or zinc dioxide is well known (Ollis et al., Environ. Sci. and Technol., 12 (1991) 1522; Heller Am. Chem. Res. 28 (1995), 503). However, the chemical characteristics of these semiconductors necessitate excitation of these metals in the ultraviolet region of the spectrum in order for the degradation of the pollutants to occur. This requirement therefore makes the use of photocatalysed degradation of soils on surfaces within a residential environment both potentially hazardous and impractical.

The present inventors have found, however, that the use of a sensitising agent in addition to the light absorbing material reduces the amount of energy required to be absorbed by said light absorber in order for charge separation to take place, and subsequently for the photocatalysed degradation of surface soils to occur. The present inventors have found that ambient light, for example sunlight or artificial light is sufficient in the presence of a sensitising agent and a light absorbing material to induce such a degradation.

The present inventors have found, in addition, that the use of highly conjugated heterocyclic complexes such as polypyridine, macrocycle or phthalocyanines with various centrally coordinated atoms such as Ru, Fe and Si can be used to sensitise a light absorbing agent (such as titanium dioxide or zinc oxide) not only when the light absorbing agent is coated onto a surface, but also when the agent is in solution. This makes the use of a light absorbing agent in conjunction with certain metal complexes in solution ideally suited for applying to a surface to provide a residue which will photocatalyse the decomposition of surface soils, and will also reduce the rate of accumulation of soils.

Previously, the photosensitisation of nanocrystalline titanium dioxide (TiO2) films by polyimide bearing pendant substituted-Ru (bpy)3+2 groups has been reported (Osora et al, J. Photochem. Photobiol. B: Biol. 43 (1998) 232). In this study it was found that these photosensitised complexes could degrade methylene blue.

Additionally, the use of metal complexes as photosensitisers in electrochemical cells is well established (Kalyanasundaram et al. Photo. Sens. And Photocat Using Inorg. And Organomet. Comps, 247-271). Now the use of particulate semiconductors such as TiO2 with sensitisers is resulting in the development of a new class of solar cell (Graetzel et al, Nature, 1991, v353, 737).

Graetzel et al (JACS V107, (1985), 2988 showed that tris(2,2'-bipyridyl-4,4'-dicarboxylate)ruthenium (II) dichloride is a superior sensitising agent for charge injection into titania at acid pH compared to tris(2,2'-bipridyl)ruthenium (II) dichloride due to the former having carboxylate anions capable of binding with titania under acid conditions. In this same work it was also shown that the sensitising properties of tris(2,2'-bipridyl)ruthenium (II) dichloride improve at pH 7 compared with lower pH.

Bendig et al (J Photochem Photobiology A: Chemistry 108 (1997) 89), describe the sensitised photocatalytic oxidation of herbicides using tris(2,2'-bipyridyl-4,4'-dicarboxylate)ruthenium (II) dichloride, tris(2,2'-bipridyl)ruthenium (II) dichloride and a methylated form of the latter. Bedig et al. showed that only tris(2,2'-bipyridyl-4,4'-dicarboxylate) ruthenium (II) dichloride is active under acid conditions (pH 3) under their experimental conditions, and the authors presented data showing that tris(2,2'-bipyridyl-4,4'-dicarboxylate)ruthenium (II) dichloride desorbs progressively as the pH is raised whereas tris(2,2'-bipridyl)ruthenium (II) dichloride is more strongly absorbed with increasing pH. The authors explain the results on the basis that titania has a point of zero charge (PZC) such that the surface is positively charged below approximately pH 6 and negatively charged at a higher pH. Accordingly, under acid conditions sensitising agents carry a negatively charged group can bind via electrostatic interaction, whereas positively charged groups will tend to be repelled. Conversely, at pH greater than the PZC value for titania, molecular moieties with positively charged groups will tend to bind more strongly with the $TiO_2$ surface.

It follows therefore, that for sensitisation to be most effective at a particular working pH, on semiconductors such as titania, zinc oxide, tin oxide etc., charged groups of the appropriate sign should be present on the absorbing sensitiser-molecule to promote binding. Thus for application at pH conditions where the semiconductor material has a excess negative charge, a sensitising molecule should preferably have a positively charged group or groups in its structure.

In the first aspect, the present invention provides a method for using a composition comprising a photocatalyst and a metal complex sensitiser comprising a ligand with a conjugated π system which absorbs light substantially in the visible and/or the infrared region of the spectrum, effective to deposit a functional residue of said composition on a surface.

The term 'functional residue,' in the context of the present invention means a residue or layer of photocatalytic composition provided on a surface whereby soils deposited on the residue or layer or soils which are present on the surface prior to the deposition of the residue or layer are subject to a photocatalytic or other photochemical oxidation, reduction, free radical or other photochemical reaction effective to substantially break down, or otherwise decompose the soil. In effect, the cleaning process continues after the conventional act of soil removal is completed. In addition, these reactions may also provide an ongoing antibacterial effect that continues after the physical cleaning process has been completed. Finally, if a functional residue of photocatalytic material is applied to a substantially clean or sterile surface then the rate of accumulation of soils on the surface will be reduced.

The term photocatalyic agent in the context of the present invention refers to an agent that has a favourable combination of electronic structure, light absorption properties, charge transport characteristics and excited-state lifetimes. Primary light absorbers for photocatalysis include but are not limited to semiconductor materials.

One model of dye sensitisation of the semi-conductor titanium dioxide, suggests that surface adsorbed dye molecules (sensitising agents) absorb visible light and inject electrons into the conduction band thus:

$D+hv\text{->}D^*$ $D^*+TiO2\text{->}D.++(TiO2+e\text{-}CB)$

The conduction band electrons may then reduce oxygen to reactive species such as OH radicals, which can rapidly attack organic molecules, i.e.

$3D30\ 3hv+O2+3H+\text{->}3D.+.OH+H2O$ on TiO2

Alternatively or simultaneously D.+ may oxidise organic molecules. In this invention it will be understood by those skilled in the art that the sensitising agent is working in a catalytic manner i.e it is not significantly altered itself during the photocatalytic cleaning process, and is therefore active over a long period of time.

Suitable photocatalytic agents include but are not limited to titanium dioxide (in the form of anatase and/or rutile and/or brookite), zinc oxide, tin oxide, cadmium sulphide, tungsten trioxide and molybdenum trioxide. Alternatively, combinations of two or more of these agents may be used. In a preferred embodiment the agent is titanium dioxide.

In the present invention, the photocatalytic composition further comprises a metal complex sensitiser. The central atom of such sensitisers can be but is not limited to ruthenium, platinum, palladium, iridium, rhodium, osmium, rhenium, iron or copper, titanium or zinc. In one embodiment suitable sensitising agents include but are not limited to heterocyclic complexes which contain polypyridine, macrocyclic or phtalocyanine ligands and optionally other ligand types wherein at least one of the nitrogen groups is displaced by other donor groups. In a preferred embodiment of the invention the complex is any one or more of ruthenium II, III or IV or mixed oxidation state chelating complexes containing nitrogen donor atoms or a ruthenium(II), (III), (IV) or a mixed oxidation state polypyridine complex.

In a further embodiment the sensitising agent includes any one or more of the following groups: terpyridyls, bipyridyls, phthalocyanines, porphyrins, tetra-aza-annulenes, pyrazines, phenanthrolines and derivatives thereof and compounds with substantially similar nitrogen based ring systems.

These groups may be derivatised to produce compounds containing positively-charged binding sites suitable for attachment to semiconductors. Thus the sensitising agent may further include any one or more of $R_4N+$ or $R_4P+$ groups wherein each R group may be the same or different and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted.

In this way, sensitising agents are specifically designed wherein the molecular structure functions in combination with semiconductors where the desired operating condition is such that the un-coated semiconductor surface presents adsorption sites with a negative charge. This will occur for instance where the composition containing said agent is of alkaline pH.

On one embodiment the sensitising agent may include a terpyridal group of general formula I shown below:

(I)

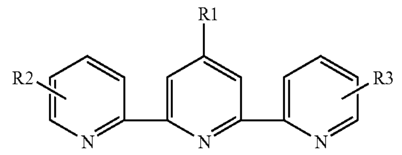

Where at least one of R1, R2 and R3 are positively charged groups which has the general formula II shown below:

(II)

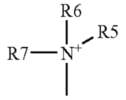

Where R5-R7 are any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted, Alternatively, or in addition the sensitising agent may include a bipyridyl group having the general formula III shown below:

(III)

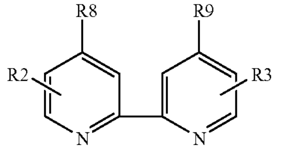

Where R8 and R9 can be the same or different and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted, R2 may be the same or different from R3 and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted, Alternatively, or in addition sensitising agents of the present invention may include phtalocyanines of general formula IV below:

(IV)

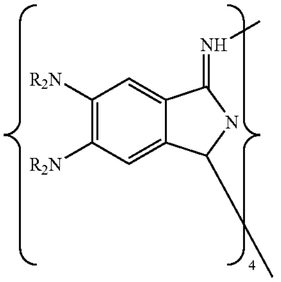

Where each R group may be the same or different and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted.

Alternatively, or in addition sensitising agents may include tetra-aza-annulenes (TADAs) of general formula V shown below.

(V)

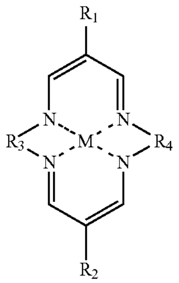

R1-R4 may be the same or different and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted.

Alternatively, or in addition the bipyridyl compounds tris(2,2'-bipyridyl-4,4'-dicarboxylate)ruthenium (II) dichloride and tris(2,2'-bipridyl)ruthenium (II) dichloride can be dimerised using pyrazine derivitives such as pyrazine, pyrimidine and 4,4'-bipyridyl linking ligands using procedures well known in the art. Again as previously discussed these will be most suitable for use in operating conditions such that the un-coated semiconductor presents absorption sites with a negative charge Compositions of the present invention will most preferably be in the form of a liquid. They may also be in the form of an emulsion, suspension, or in particulate form. Preferably, the light absorbing agent will comprise no more than 50% w/v of the photocatalytic composition, more preferably the light absorbing agent will comprise no more than 10% w/v of the photocatalytic composition. More preferably still the light absorbing agent will comprise no more than 1% w/v of the photocatalytic composition. Yet more preferably the light absorbing agent will comprise no more than 0.1% w/v of the photocatalytic composition. Preferably the sensitising agent will comprise no more than 1% w/v of the photocatalytic composition. More preferably the sensitising agent will comprise no more than 0.1% w/v of the photocatalytic composition.

The compositions of the present invention are effective at a whole range of pH values from 1 to 14. For compositions comprising sensitising agents of the present invention which contain polypyridine, macrocyclic or phthalocyanine ligands and optionally other ligand types wherein at least one of the nitrogen groups is displaced by other donor groups, in particular any one or more of: sensitising agent is ruthenium II, III or IV or mixed oxidation state chelating complexes containing nitrogen donor atoms, or a ruthenium (II), (III), (IV) or a mixed oxidation state polypyridine complex, then these compounds perform most effectively at pHs corresponding to a positive charged surface-state of the semiconductor component e.g for titania this corresponds to a pH of less than 7. Thus in a preferred embodiment of this aspect of the invention a composition comprising sensitising agents described above and also titania preferably has a pH of less than 7, even more preferably of less than 6, more preferably still of less than 5.

For compositions comprising a sensitising agent according to the present invention which includes any one or more of the following groups: terpyridyl, bipyridyls, phthalocyanines, porphyrins, tetra-aza-annulenes, pyrazines, phenanthralines and derivatives thereof and compounds with substantially similar nitrogen based ring systems, and may further include any one or more of $R_4N+$ or $R_4P+$ groups wherein each R group is as hereinbefore described, the preferred pH of the composition corresponds to the value where the semi-conductor component has a negatively charged surface. For titania this is pH 7 or greater. Even more preferred is a pH of greater than 8, more preferred still a pH of greater than 9.

It is also the case that even where the semiconductor component has a surface-excess of positive charge at a particular pH, negatively charged sites for binding positively charged sensitising agents may well be present so that both charge types of sensitiser may effectively be used. Similarly, for systems where mixed semiconductor components e.g. titania with zinc oxide, are used both charge types of sensitising agents may be employed.

In a further aspect the present invention provides a sensitising agent which includes any one or more of the following groups: terpyridyl, bipyridyl, phthalocyanine, porphyrins, tetra-aza-annulenes, pyrazines, phenanthrolines and derivatives thereof and compounds with substantially similar nitrogen based ring systems.

The sensitising agents listed above further includes any one or more of $R_4N+$ or $R_4P+$ where R5-R are any one or more of the following groups: hydrogen, halogen, amine, alkyl, aryl, arylalkyl, alkoxy, heterocyclic groups, or derivates thereof, including acid and ester derivatives, any of which may be branched or unbranched, substituted or unsubstituted. These groups may be derivatised to produce compounds containing positively-charged binding sites suitable for attachment to semiconductors as hereinbefore described.

In yet a further aspect, the present invention provides that use of a sensitising agent according to the present invention for the sensitisation of a light absorbing agent on a surface such that soils present on the surface are substantially broken down and/or the rate of accumulation of such soils on a surface is significantly diminished.

The term 'the rate of accumulation of soils is significantly diminished' in the context of the present invention means that the rate is significantly diminished as compared with a similar sample in which no sensitising agent has been applied.

The photocatalytically active composition, may be doped with an additional element which has the effect of reducing the energy required to promote an electron of the photochemically active material to the conductance band. Suitable doping agents may include but are not limited to platinum, palladium, cobalt, silver, copper, nickel or iron, tungsten, chromium. These may be present as the metals themselves, and/or as complexes and/or compounds thereof.

Compositions of the present invention may further include a wetting agent which may be any one or more of the following: Igepal® CA-520 [polyoxyethylene(5)isooctylphenyl ether], Igepal® CA-630 [(octylphenoxy)polyethoxyethanol], Igepal® CA-730 [polyoxyethylene(12) isooctylphenyl ether]. Preferably the concentration used will be between 0.5-5.0 wt %, even more preferably between 0.5 and 3 wt %, more preferably still between 0.5 and 2.0 wt %.

The photocatalytic compositions and/or sensitising agents of the present invention can be used in conjunction with those conventional ingredients of cleaning materials known to those skilled in the art. These may include but are not limited to water, anionic, non-ionic or amphoteric surfactants. Grease cutting, surfactant synergistic or other solvents may also be included as may antibacterial agents, suspending agents, colourants, perfumes, thickeners, preservatives and so on. Some or all of the ingredients may be of high volatility whereby a residue of photochemically active material can be left behind on a surface in a controlled manner.

The sensitising agent, or compositions according to the present invention may be applied to the surface in any appropriate form such as, for example, a liquid, cream, mousse, emulsion, microemulsion or gel form and may be dispensed either directly from the bottle or by means of for example an aerosol, pump action dispenser. These means will be known to those in the art.

One skilled in the art will appreciate that generally the compositions and/or sensitising agent according to the present invention once deposited on the surface should be substantially imperceptible to the user. This may be achieved by using materials, agents and compositions with a microscopic particle size. The microscopic particle size also aids in achieving a uniform dispersion throughout the materials and/or compositions thus maximising the efficiency of the photochemical reaction. Preferably the particle size is less than 100 nm, more preferably the particle size is less than 50 nm and more preferably still it is less than 20 nm In some circumstances one skilled in the art will appreciate the need for the photocatalytic composition and/or sensitising agent to possess larger particle sizes.

The invention will now be described with reference to the following examples in which are in no way limiting of the invention, and in which:

FIG. 1 represents the UV/Visible spectra of the λ max of the target dye Gentian Violet disappearing with time as described in example 6. Horizontal axis is wavelength in nm. Vertical axis is absorbance in units measured using UV spectrometer (UV/vis spectrometer-UV 4-UNICAM) ♦ represents sensitised TiO2+0.1 ml Gentian Violet dye (GV) at T=0 mins, ■ Sensitised TiO2+0.1 ml GV T=30 mins, ▲ Sensitised TiO2+0.1 ml GV T=1 hour, X Sensitised TiO2+0.1 ml GV T=2 hours, — Sensitised TiO2+0.1 ml GV T=3 hours, ● Sensitised TiO2+0.1 ml GV T=4 hours.

Figure 2:
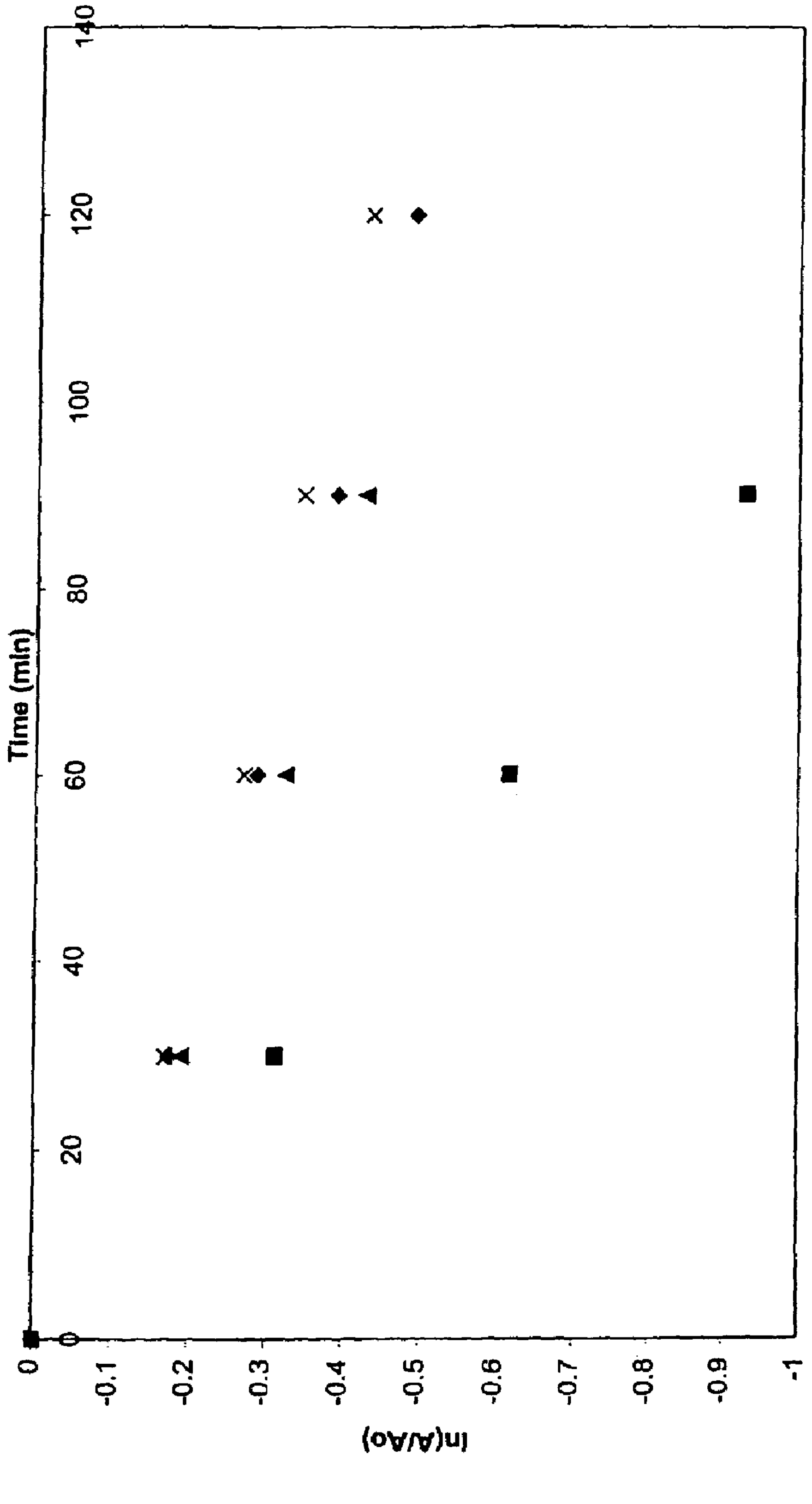
Figure 3:
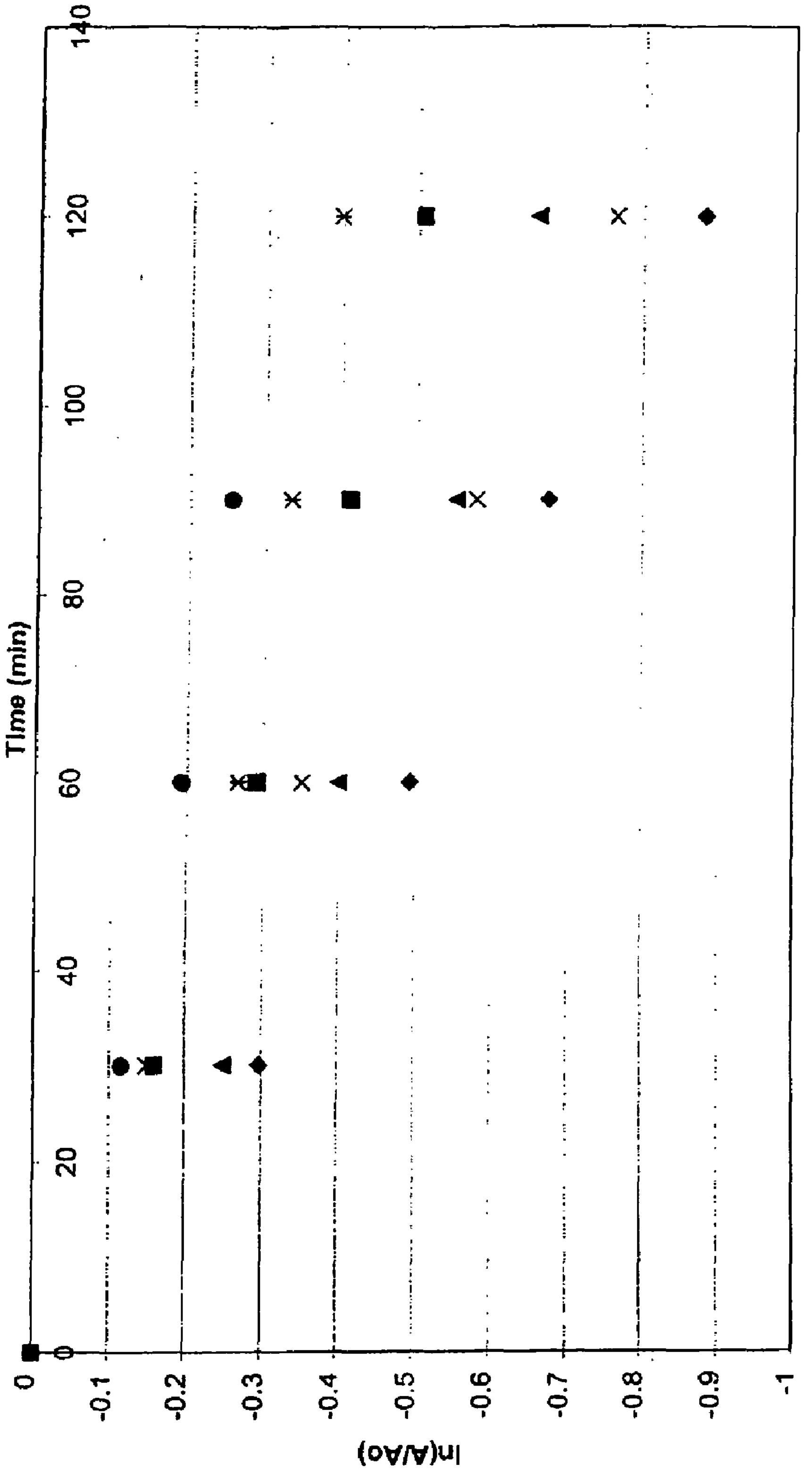

FIG. 2 represents the activity of TiO2 sol (sol 1) as described in example 8. Horizontal axis represents time and the vertical axis represents the change in absorbance measured using a (UV/vis spectrometer-UV 4-UNICAM) ♦ represents the activity of sensitised TiO2 at pH 3.28, ■ Activity of sensitised TiO2 at pH 2.08, ▲ Activity of sensitised TiO2 at pH 2.72, X Activity of sensitised TiO2 at pH 4.02.

Feature 3 represents the activity of $TiO_2$ sol (sol 2) as described in example 8. Horizontal axis represents time and the vertical axis represents the change in absorbance measured using a (UV/vis spectrometer-UV 4-UNICAM) ♦ represents the activity of sensitised $TiO_2$ at pH 2.00, ■ Activity of sensitised $TiO_2$ at pH 2.64, ▲ Activity of sensitised $TiO_2$ at pH 4.12, × Activity of sensitised $TiO_2$ at pH 3.39,* Activity of sensitised TiO2 at pH 5.00, ● Activity of sensitised $TiO_2$ at pH 5.98.

Figure 4:
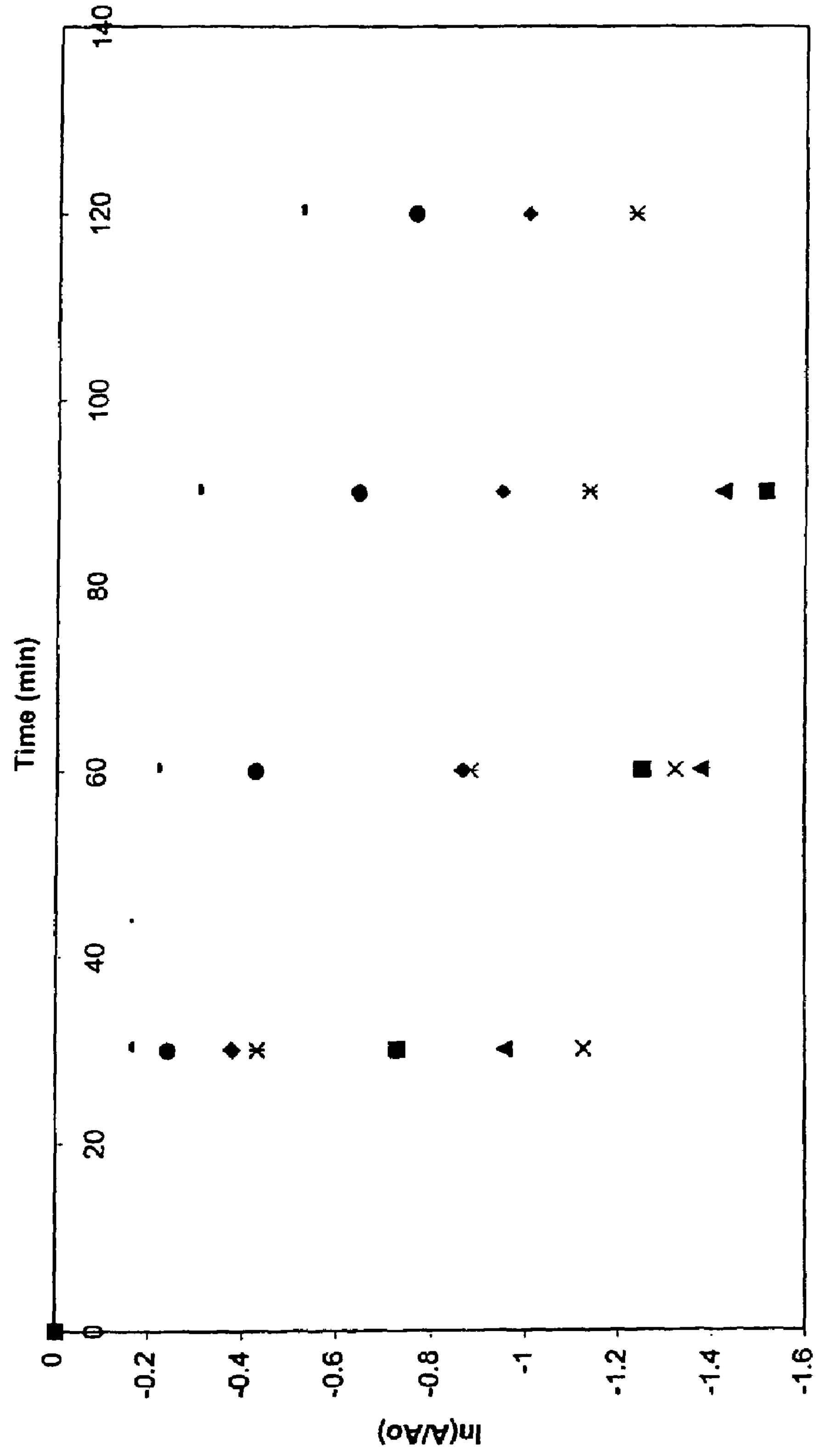

FIG. 4 represents the activity of the $TiO_2$ sol (sol 3) as described in example 8. Horizontal axis represents time and the vertical axis represents the change in absorbance measured using a (UV/vis spectrometer-UV 4-UNICAM) ♦ represents the activity of sensitised TiO2 at pH 4.1, ■ Activity of sensitised $TiO_2$ at pH 3.2, ▲ Activity of sensitised $TiO_2$ at pH 2.7, × Activity of sensitised TiO2 at pH 2.1, * Activity of sensitised TiO2 at pH 5.2, ● Activity of sensitised $TiO_2$ at pH 6.0, — Activity of sensitised $TiO_2$ at pH 6.5-7.0.

Figure 5:
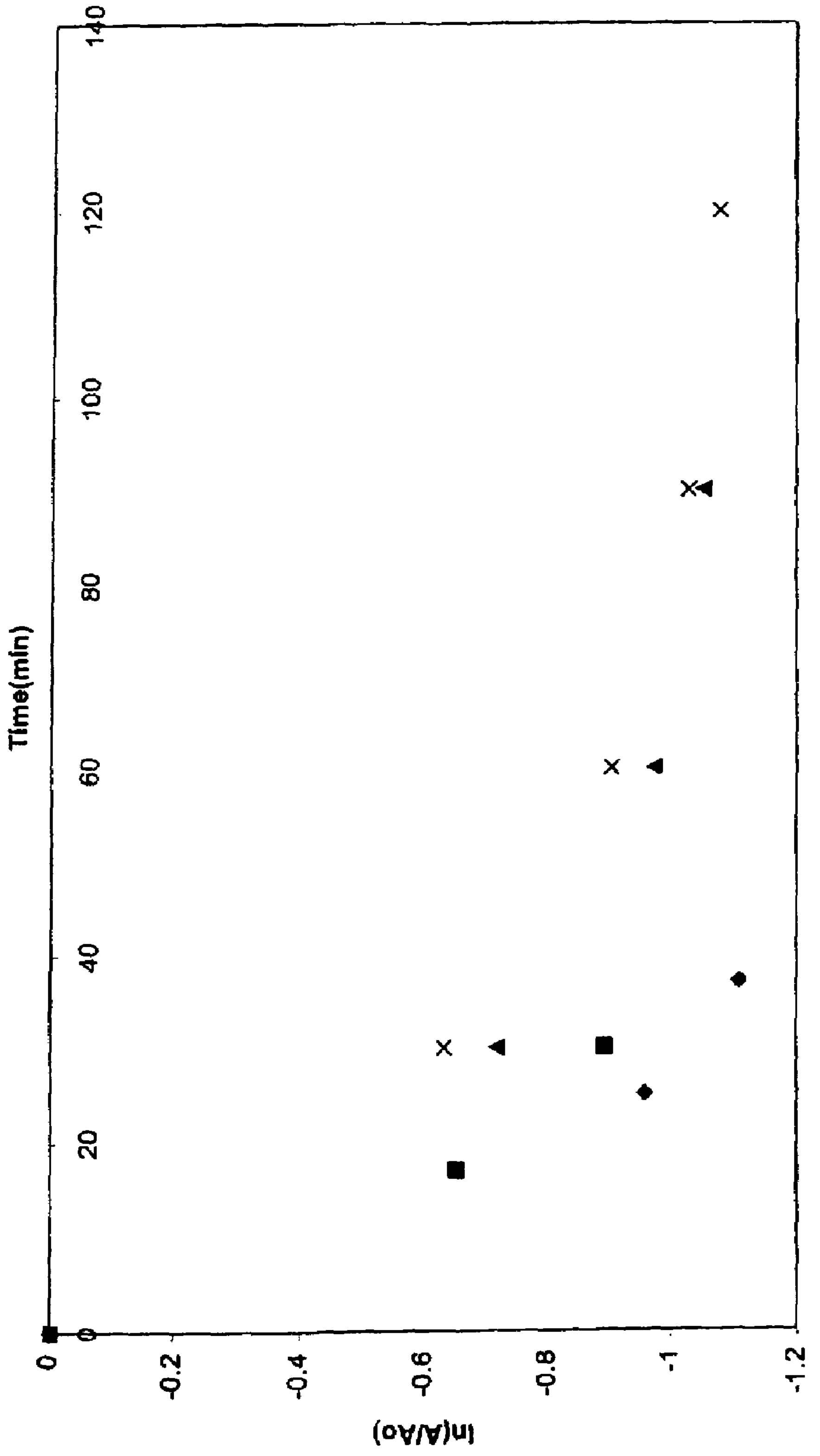

FIG. 5 represents the activity of $TiO_2$ (sol 4) as described in example 8. Horizontal axis represents time and the vertical axis represents the change in absorbance measured using a (UV/vis spectrometer-UV 4-UNICAM) ♦ represents the activity of sensitised $TiO_2$ at pH 2.74, ■ Activity of sensitised $TiO_2$ at pH 2.12, ▲ Activity of sensitised $TiO_2$ at pH 3.38, × Activity of sensitised $TiO_2$ at pH 4.00.

Figure 6:
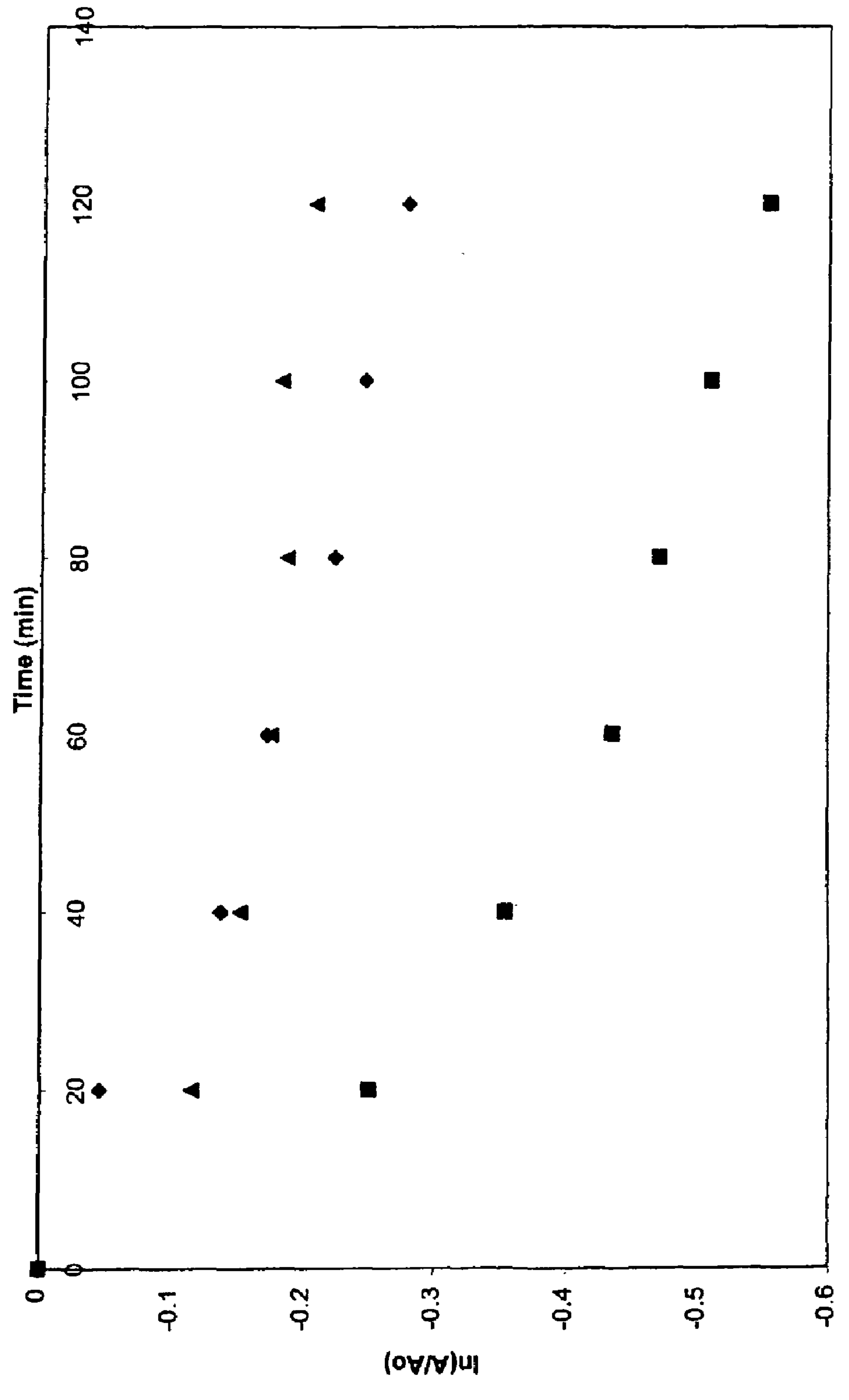

FIG. 6 represents the activity of sensitised $TiO_2$ sol at different pH as described in example 9. Horizontal axis represents time and the vertical axis represents the change in absorbance measured using a (UV/vis spectrometer-UV 4-UNICAM) ♦ represents the activity of sensitised solution (1) at pH 6.7, ■ Activity of sensitised $TiO_2$ at pH 5.2, ▲ Activity of sensitised $TiO_2$ at pH 8.8.

Figure 7:
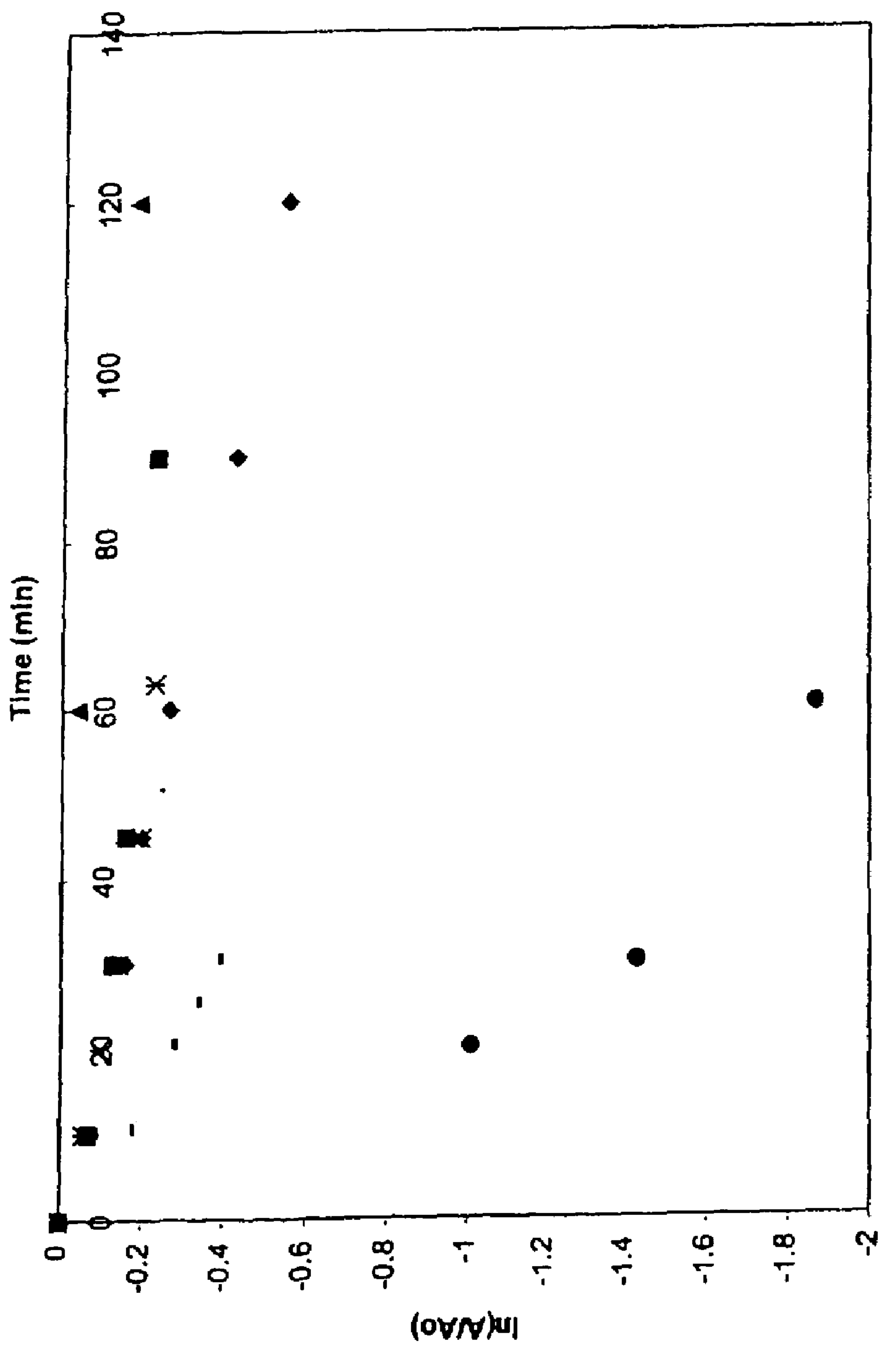

FIG. 7 represents the effect of the light source in photocatalytic activity as described in example 11. Horizontal axis represents time and the vertical axis represents the change in absorbance measured using a (UV/vis spectrometer-UV 4-UNICAM) ♦ represents daylight bulb 40 W, ▲ daylight bulb 100 W, * fluorescent 8 W, ■ tungsten filament 35 W, ● overhead projector, — tungsten filament 100 W.

EXAMPLES

In the following examples OHP represents overhead projector, GV stands for Gentian Violet dye.

Example 1

A nanocrystalline titanium dioxide sol was applied to the surface of a previously cleaned glass microscope slide by spin coating 0.5 ml of the titanium dioxide sol at 1500 rpm for 30 seconds. The glass slide was then fired at 450° C. for 30 minutes. Once cool the process was repeated two further times to give 3 coats of the nanocrystalline titanium dioxide. The slide was then immersed in an aqueous $1\times10^{-}6$M solution of tris(2,2'-bipyridyl-4,4'-dicarboxylate)Ru(II) (dichloride) for 30 minutes to allow adsorption of the sensitising agent to the titanium dioxide. The slide was removed, rinsed with water to remove any unbound ruthenium complex and then stained with a 0.3% Gentian Violet solution (N-4[Bis[4-dimethylamino)-phenyl]methylene]-2,5-cyclohexadien-1-ylidenel]-N-methylmethanaminium chloride) in 20% ethanol by immersing in the dye for 5 minutes. Once again the slide was washed with water to remove any unbound dye. The whole process was repeated once more for a second identical slide and then twice more, but omitting immersing these two slides in the tris(2,2'-bipyridyl-4,4'-dicarboxylate)Ru(II)(dichloride) to give two un-sensitized control slides.

One each of the sensitised and un-sensitised slides was kept in total darkness. The other two slides were placed on top of an overhead projector fitted with two 24V 250 W tungsten halogen bulbs. Decolourisation of the purple colour was monitored as the Gentian Violet was decomposed photocatalytically. Within 50 minutes there was a noticeable difference between the colour of the sensitised and un-sensitised slides particularly when compared to the controls stored in the dark. On the slide with the sensitised titanium dioxide the Gentian Violet was decomposing and hence the purple colour fading. This continued until there was no purple colour left. Decomposition of the Gentian Violet did also occur on the un-sensitised slide but at a significantly slower rate.

Example 2

A nanocrystalline titanium dioxide sol thickened with methylcellulose was screen printed on to a series of cleaned glass microscope slides. The printed titanium dioxide films were then fired at 450° C. for 30 minutes. Half of the slides were then immersed in an aqueous $1\times10^{-6}$M solution of tris(2,2'-bipyridyl-4,4'-dicarboxylate)Ru(II)(dichloride) for 30 minutes to allow adsorption of the sensitising agent to the titanium dioxide. The slides were then removed from the sensitising solution and washed with water to remove any unbound ruthenium complex. All the slides, both sensitised and unsensitised were then divided into two groups. One set was immersed in 0.3% Gentian Violet solution (N-4-[Bis[4-dimethylamino)-phenyl]methylene]-2,5-cyclohexadien-1-ylidene]-N-methylmethanaminium chloride) in 20% ethanol for 5 minutes and the second set into a 0.3% aqueous solution of Acid Orange dye (4-[(2-hydroxy-1-napthalenyl) azo]-benzenesulfonic acid monosodium salt) for 5 minutes. A sensitised and unsensitised slide dyed with either the Gentian Violet or Acid Orange stains was placed in total darkness and used as a control for each treatment. A second equivalent set was left exposed to daylight next to the window of a south-facing window. A third and final set was also left exposed to the daylight through a south-facing window but these slides were covered with a 6 mm thick piece of Perspex which substantially absorbs the UV component of the light. Decolourisation of both the purple and orange colours was monitored as both the Gentian Violet and Acid Orange were decomposed photocatalytically. After 48 hours exposure to light the slides dyed with Gentian Violet and left directly on the open bench were partially decolourised. The slides stored under the Perspex had begun to decolourize but at a slower rate than those not under Perspex. By day 7 the dye on all the slides left just on the bench had either completely or almost completely disappeared. The slides under Perspex reached the same amount of decolourization on day 14. There was no change in the colour of the slides stored in the dark. All the light exposed slides were re-dyed with either Gentian Violet or Acid Orange and treated exactly as before. None of the Acid Orange stained slides would re-stain. The sensitised titanium dioxide slides stained with Gentian Violet and exposed directly to daylight decolourised completely within 24 hours. The unsensitised slide had still not completely decolourised 5 days after restaining. The slides under Perspex were still coloured 5 days after restaining, however the sensitised slide had faded to a greater extent than the unsensitised slide.

Example 3

To 1.0 ml of a nanocrystalline titanium dioxide solution, 4.0 ml of a $3.4\times10^{-5}$ M aqueous solution of tris(2,2'-bipyridyl-4,4'-dicarboxylate)Ru(II)(dichloride) were added and the resulting solution mixed well using a vortex mixer. A film of this solution was prepared by spin coating 0.1 ml of this solution at 1500 rpm on a clean glass microscope slide for 30 seconds. The film was dried using a hand held hot air drier and the process repeated twice more to give a total of 3 coats on the microscope slide. A second slide was then prepared in exactly the same way. Both slides were then immersed into a solution of 0.3% Gentian Violet (N-4-[Bis [4-dimethylamino)-phenyl]methylene]-2,5-cyclohexadien-1-ylidenel]-N-methylmethanaminiurm chloride) in 20% ethanol for 5 minutes. The slides were removed, rinsed with water to remove any excess stain and allowed to air dry. One slide was kept in total darkness and the second was placed on top of a piece of 6 mm thick Perspex (to remove any UV light) on an overhead projector fitted with two 24V 250 W tungsten halogen bulbs. The purple colour on the light exposed slide steadily decomposed and after 3 hours had completely faded. There was no change in the colour of the slide stored in darkness.

Example 4

Titania Sols Preparation

Kormann Method. (C. Kormann, D. W. Bahnemann, M. R. Hoffmann, J. Phys. Chem., 1988, 92, 5196)

$TiCl_4$ (3.5 ml) was slowly added to cold de-ionised water (900 ml) under vigorous stirring. The resulting clear solution was stirred at 0° C. for 3 hours then dialysed between 2 hours and 24 hours. The clear solution is then dried using a rotary-evaporator (Temperature of water bath=30° C.). The resulting white powder ($TiO_2$) is then re-suspended into de-ionised water at the desired concentration. The dialysis membrane—Visking—Size1350/1 MWCO 1350 Daltons was treated prior to use. The membrane was left for 30 minutes at 80° C. in a solution containing EDTA (1 mM) and 2% $NaHCO_3$. The membrane was then washed thoroughly with de-ionised water.

Method According to GB 1 412 937

An aqueous $TiCl_4$ solution (50 ml of $TiCl_4$ diluted in 500 ml de-ionised water) was added into a beaker containing de-ionised water (3 L) and concentrated ammonia (40 ml) with continuous stirring. The white mixture was stirred for about 20 minutes then allowed to settle. he supernatant was removed using a peristaltic pump. The volume was completed again to 3 L with de-ionised water, stirred then allowed to settle. The supernatant was removed. This process was repeated twice. The volume was completed with de-ionised water to 3.5 L. The mixture was stirred, the pH was checked (pH 8.8) then a nitric acid solution (1M) was added slowly to get pH close to 3.3. The mixture was stirred for 30-45 minutes then allowed to settle. The supernatant was removed the nitric acid (1M, 23.2 ml) was added to the white mixture was stirred for about 20 minutes then was left to age for about a week. In order to increase the peptisation step, the mixture can be heated gently to 60-70° C. for 30 minutes then allowed to settle.

Isopropoxide Route

Titanium-isopropoxide (Aldrich, 400 ml, 97%) was added rapidly to a beaker containing de-ionised water (1 L). The precipitated $TiO_2$ was decanted and washed 4 times with de-ionised water (4×500 ml) then filtered. The wet filtered solid was digested at 70° C. with concentrated nitric acid (16.7 ml) and de-ionised water (volume total 800 ml) for 30 min to 1 h 30 min to produce a sol.

Example 5

Synthesis of Tris(2.2'-dipyridyl-4,4'-dicarboxylate) ruthenium(II)(dichloride)

$RuCL_3,xH_2O$ (1.33 mmol Ru), 1-methyl-2-pyrrolidinone (15 ml) and 2,2'-dipyridyl-4,4'-dicarboxylate (4.1 mmol) were added into a round bottomed flask and then purged with Ar5 on $N_2$. The mixture was heated to reflux in the dark for 1 h 30 min. 1-methyl-2-pyrrolidinone (25 ml) was added to the flask and the reflux was continued for a further 2 hours under Ar or $N_2$. The mixture was allowed to cool to room temperature and kept under Ar or $N_2$ overnight. The dark mixture was filtered. The resulting reddish brown solid was washed with 1-methyl-2-pyrrolidinone (2×20 ml) and diethyl ether (3×20 ml) then dried under vacuum. Yield=0.61 g. Product contained 1.2moles of 1-methyl-2-pyrrolidinone.

Example 6

Activity Test

A mixture of $TiO_2$ sol (1 ml, 1 g/L) and tris(2,2'-dipyridyl4,4'-dicarboxylate)ruthenium(II)(dichloride) (4 ml, $c=3.4\times10^{-5}M$) was stirred for about 1 minute using a rotamixer. The pH was recorded then the target dye gentian violet (GV dissolved in 20% ethanol solution, 0.05 ml or 0.08 ml, 0.03 wt/v %) was added and the mixture was stirred again. The initial colour of the sensitised $TiO_2$ sol was yellow. Addition of gentian violet produced a purple colour at pH 3 and higher. A UV/Visible spectrum was taken at this stage. The vial containing the mixture was placed onto an overhead projector (2 cm height from the glass, in order to reduce heat). A UV/Visible spectrum was used to observe the colour change over a period of time at lamda max of the Target dye (Gentian violet or crystal violet)=588 nm in the white light spectrum. (OHP used: Model Ensign. Lamp:24V-250 W-3860 lux)

In order to get quantitative data a UV/Visible spectrum was taken at different times. The results are shown in FIG. 1.

Example 7

Effect of Different Steps of a Preparation, Effect of Pentisation and pH Effect.

The "activity" has been tested at different stages of the preparation of the $TiO_2$ by hydrolysis of $TiCl_4$ (Kormann Method-see example 4 for details). The effect of peptisation has also been looked at. From the results shown in Table 1, the peptisation as well as the particle size seemed to have little effect on the activity.

The details of the different preparations as well as the activity test are summarised in Example 4 and 6.

TABLE 1

Effect of peptisation on activity.

| Code | Ti Source | $TiO_2$ sol Preparation | Temp of Peptisation | Time for Peptisation | Particle size (nm) | Time to decolourise 0.05 ml Gv |
|---|---|---|---|---|---|---|
| Sol A | $TiCl_4$ | Prepared as per example 1 of GB 1412 937 (Woodhead) | 60-65 C. for 30 mins | 99% after 48 hours | 22.5 | 30 min |
| Sol B | Ti isopropoxide | Isopropoxide route | Ambient | 99% after 7 days | 20.7 | 90 min |
| Sol C | Ti isopropoxide | Isopropoxide route | 60 C. for 30 mins | *95% after 7 days | 34.5 | 40 min |
| Sol D | Ti isopropoxide | Isopropoxide route | 70 C. for 30 mins | 30 min | 95.4 | 55 min |
| Sol E | $TiCl_4$ | Prepared as per example 1 of GB 1412 937 (Woodhead) | Ambient | 99% after 7 days | 20.3 | 60 min |

*Significant amount of non-dispersed material present after 5 days so further nitric acid (1M) was added to give $NO^{3-}$:Ti ca 0.27

Note:

the mixture was 1 ml TiO2 (1 g/L) and 3 ml sensitiser ($c = 3.4\times10^{-5}M$)

Example 7b

The pH of the sensitised sol ($TiO_2$ sol prepared by Kormann method) was found to be different at each step of the process. The results are summarised in Table 2. The pH was measured using a pH meter (HANNA Instruments—H18424 microcomputer).

TABLE 2

Effect of different steps of the process on activity.

| Steps of the process | pH of the sensitised sol | Time to decolourise 0.08 ml Gentian Violet |
|---|---|---|
| Before dialysis | 1.85 | 2 h 45 min |
| After dialysis | 2.95 | 2 h 20 min |
| Sol dried using rotary-evaporator then re-suspended | 3.16 | 4 h 40 min |
| Sol dried using freeze-drier then re-suspended* | 3.08 | 2 h 45 min mixture stil purple. |

*$TiO_2$ was very difficult to re-suspend. After sonication the sol was cloudy.

The results indicate that the activity may be related to pH.

Example 8

The effect of pH on activity of various sols

Four different sols have been tested at pH ranging from 2 to 7. They are:

(Sol 1) Hydrolysis of $TiCl_4$ followed by a dialysis, dried on rotary-evaporator then re-suspended. The pH of the sol was adjusted with HCl (1M) or NaOH (0.01M).

(Sol 2) Hydrolysis of $TiCl_4$ followed by a dialysis only. The pH of the sol was adjusted with HCl (1M) or NaOH (0.01M).

(Sol 3) Precipitation of titanium-isopropoxide followed by peptisation with nitric acid. The pH of the sol was adjusted with $HNO_3$ (0.1M) or NaOH (0.01M).

(Sol 4) Precipitation of $TiCl_4$ followed by preptisation with nitric acid. The pH of the sol was adjusted with $HNO_3$ (0.1M) or NaOH (0.01M).

This experiment was carried out over a 2 hour period. All sols were prepared at 1 g/L and the amount of Gentian Violet (0.08 ml, 0.03 wt/v %) was kept the same for each type of sol. Most of the sensitised sols had a precipitate or were precipitating. However, the systems were still working even in presence of a precipitate. The "activity" was reduced with an increase of pH. The results are summarised in Table 3.

A mixture of $TiO_2$ sol (1 ml, 1 g/L) and tris(2,2'-dipyridyl-4,4'-dicarboxylate)ruthenium(II)(dichloride (4 ml, c=3.4×$10^{-5}$M) was stirred for about 1 minute using a rotamixer. The pH was adjusted then the target dye gentian violet (GV dissolved in 20% ethanol solution, 0.08 ml, 0.03 wt/v %) was added and the mixture was stirred again. The initial colour of the sensitised $TiO_2$ sol was yellow. Addition of gentian violet produced a purple colour at pH 2.5 and higher. Below pH 2.5, addition of gentian violet produced a blue-green colour. A UV/Visible spectrum was taken at this stage. The vial containing the mixture was placed onto an overhead projector (2 cm height from the glass, in order to reduce heat). A UV/Visible spectrum was used to observe the colour change over a period of time. (OHP used: Model Ensign. Lamp:24V-250 W-3860 lux). In order to get quantitative data a UV/Visible spectrum was taken at different times.

TABLE 3 pH effect on the activity of different type of sols.

| Sol preparation | pH of sensitised sols | Time to decolourise 0.08 ml Gentian Violet | Activity rank |
|---|---|---|---|
| 1 | 2.08 | The mixture was nearly yellow and clear after 2 hours. | High |
| | 2.72 | The mixture was orange-pink with a slight precipitate after 2 hours. | Medium |
| | 3.28 | The mixture was still purple with a precipitate after 2 hours. | Low |
| | 4.02 | The mixture was orange-pink with a precipitate after 2 hours. | Medium |
| 2 | 2.00 | The mixture was green-yellow with no real precipitate after 2 hours. | High |
| | 2.64 | The mixture was orange-pink with a precipitate after 2 hours. | Medium |
| | 3.39 | The mixture was orange-pink with a precipitate after 2 hours. | Medium |
| | 4.12 | The mixture was orange-pink with a precipitate after 2 hours. | medium |
| | 5.00 | The mixture was purple with a precipitate after 2 hours. | Low |
| | 5.98 | The mixture was purple with a precipitate after 2 hours. | Low |
| 3 | 2.1 | The mixture was yellow with a precipitate after 25 minutes. | High |
| | 2.7 | The mixture was yellow with a precipitate after 35 minutes. | High |
| | 3.2 | The mixture was yellow with a precipitate after 1 h 30 min | High |
| | 4.1 | The mixture was yellow with a precipitate after 2 hours. | High |
| | 5.2 | The mixture was yellow with a precipitate after 2 hours. | High |
| | 6.0 | The mixture was orange-pink with a precipitate after 2 hours. | Medium |
| | 7.6 | The mixture was purple with a precipitate after 2 hours. | Low |
| 4 | 2.12 | The mixture was yellow after 30 minutes. | High |
| | 2.74 | The mixture was yellow with a precipitate after 25 minutes. | High |
| | 3.38 | The mixture was yellow with a precipitate after 1 h 30 min. | High |
| | 4.00 | The mixture was yellow with a precipitate after 2 hours. | High |

The results are also shown in FIG. 2, FIG. 3, and FIG. 4, and FIG. 5.

Example 9

Addition of Stabilisers

Buffer solutions were obtained by diluting the powder buffer (BDH chemicals) into the required amount of de-ionised water.

Attempts to stabilise $TiO_2$ sols prepared from the hydrolysis of $TiCl_4$ (Kormann method) were made using buffer solution pH 7 and pH 9.2. Addition of buffer solution pH 7 into a $TiO_2$ sol (10 ml, 1 g/L) produced a precipitate at pH 7. Addition of a buffer solution pH 7 or pH 9.2, de-ionised water and solid $TiO_2$ produced cloudy solutions at different pHs (see Table 4).

TABLE 4

Buffer solutions addition effect.

| No solutions | Sols Compositions | pH | Particle size (nm) | Observations |
|---|---|---|---|---|
| 1 | 2 ml buffer pH 7<br>10 ml water<br>9-10 mg $TiO_2$ | 6.8 | 208 nm | Cloudy. No apparent precipitate |
| 2 | 2 ml buffer pH 7<br>8 ml water<br>9-10 mg $TiO_2$ | 6.9 | 120 nm | Cloudy. No apparent precipitate. |
| 3 | 1 ml buffer pH 7<br>10 ml water<br>9-10 mg $TiO_2$ | 6.5 | 121 nm | Cloudy. No apparent precipitate. |
| 4 | 1 ml buffer pH 7<br>9 ml water<br>9-10 mg $TiO_2$ | 5.2 | 189 nm | Cloudy. No apparent precipitate. |
| 5 | 0.5 ml buffer pH 7<br>9.5 ml water<br>9-10 mg $TiO_2$ | 5.2 | | Cloudy. A precipitate was observed after 1 h 30 min. |
| 6 | 1 ml buffer pH 9.2<br>10 ml water<br>9-10 mg $TiO_2$ | 8.2 | | Cloudy. |
| 7 | 2 ml buffer pH 9.2<br>10 ml water<br>9-10 mg $TiO_2$ | 8.8 | | Cloudy. |

Solutions (1) and (4) were found to be cloudier than solutions (2) and (3). The particle size was higher for (1) and (4) this may correspond to the cloudiness of the solutions. After 24 hours, a slight precipitate was observed in solutions (1) and (4).

Attempts were made to increase pH with sodium hydroxide solutions failed. Addition of acetylacetonate to a $TiO_2$ sol produced a stable sol with a pH of 2.3-2.4. Increasing the pH with a sodium hydroxide solution produced precipitation at pH around 7.

The activity was tested for the sensitised solution (1), sensitised $TiO_2$ sols at pH 5.0 and 8.8 (note: the pH was increased by addition of NaOH (0.01M)). The target dye decolourised quicker at pH 5 although for all three samples there was some target dye left not decolourised after 2 hours. The results are summarised in FIG. 6.

Poly(vinyl alcohol) (PVA) was tested as a potential stabiliser for $TiO_2$ sols. It was found that addition of a large excess or too little caused precipitation of the sols when the pH was increased with sodium hydroxide. PVA can be dissolved by sonication or by gentle heating in water then can be added to a $TiO_2$ sol. Addition of PVA directly to a $TiO_2$ sol, produced a precipitate.

The activity of a sensitised sol containing PVA at pH around 3 and 7 was tested. The results show that PVA and an increase in pH slowed down the activity.

Example 10

$TiO_2$:Sensitiser Ratio Effect

The ratio $TiO_2$:Sensitiser or $TiO_2$:Ru has been looked at for a particular $TiO_2$ sol (Kormann method, $TiO_2$ sol dialysed only). The sol tested was obtained from hydrolysis of $TiCl_4$ followed by a dialysis. The experiment involved variation of ruthenium and kept the $TiO_2$ fixed. The target dye was decolourised quicker in 1:6 $TiO_2$:Ru ratio than in 1:2 $TiO_2$:Ru ratio The target dye gentian violet (0.05 ml, 0.03 wt/v %) was decolourised within 3 hours in 1:6 $TiO_2$:Ru ratio whereas in 1:4 $TiO_2$:Ru ratio and 1:2 $TiO_2$:Ru ratio the gentian violet decolourised within 4 and 5 hours, respectively.

Example 11

Light Source Effect.

A mixture of $TiO_2$ sol (1 ml, 1 g/L) and tris(2,2'-dipyridyl-4,4'-dicarboxylate)ruthenium(II)(dichloride (3 ml, c=3.4×$10^{-5}$M) was stirred for about 1 minute using a rotamixer. Addition of gentian violet (0.05 ml, 0.03 wt/v %) produced a purple colour. A UV/Visible spectrum was taken at this stage. The vial containing the mixture was placed onto an overhead projector (2 cm height from the glass, in order to reduce heat) or in a light box. UV/Visible spectra were used to observe the colour change over a period of time. Normally all the activity work was done using an overhead projector as a light source. Other light sources such as daylight bulbs (40 W and 100 W), tungsten filament tube (35 W), tungsten filament bulb (100 W) and fluorescent tube (8 W) have also been investigated during this study. The results showed that the process still works with all light sources tried albeit much slower using daylight or tungsten filament bulbs than the light from an overhead projector because of the higher intensity of the overhead projector.

The Results are shown in FIG. 7

Example 12

A range of dyes have been tested as potential sensitising agent. They include: copper or iron complexes containing sulfonated phtalocyanine ligands, silicon complex containing phtalocyanine ligand and ruthenium complexes containing bipyridyl or functionalised bipyridyl complexes (e.g: carboxylate, phosphonate) ligands and anions (e.g.: Cl, NCS) and rose bengal.

A mixture of $TiO_2$ sol (1 ml, 1 g/L) and sensitizing agent (3 ml, c=3.4×$10^{-5}$M) was stirred for about 1 minute using a rotamixer. Addition of gentian violet (0.05 ml, 0.03 wt/v %) was added as a target dye. A UV/Visible spectrum was taken at this stage. The vial containing the mixture was placed onto an overhead projector (2 cm height from the glass, in order to reduce heat). UV/Visible spectra were used to observe the colour change over a period of time. All dyes tested decolourised the target dye gentian violet at different rates.

Example 13

Activity of Different $TiO_2$ sols.

Several $TiO_2$ sols have been tested for their activity including commercially available types from the Millennium Performance Chemicals, 85 Avenue Victor Hugo, 92563 Rueil-Malmaison Cedex, France. A mixture of $TiO_2$ sol (1 ml, 1 g/L) and tris(2,2'-dipyridyl-4,4'-dicarboxylate) ruthenium(II)(dichloride) (4 ml, c=3.4×$10^{-5}$M) was stirred for about 1 minute using a rotamixer. Addition of gentian violet (0.08 ml, 0.03 wt/v %) produced a purple colour. A UV/Visible spectrum was taken at this stage. The vial containing the mixture was placed onto an overhead projector (2 cm height from the glass, in order to reduce heat). UV/Visible spectra were used to observe the colour change over a period of time. The results are summarised in Table 5.

TABLE 5

Activity of different sols.

| TiO2 sol source | Time required to decolourise 0.08 ml of gentian violet (0.03 wt/v %) |
|---|---|
| Kormann method | >4 hours |
| J. Woodhead Patent | 1 h 30 mins |
| Isopropoxide route | 1 h 30 mins |
| Millennium sol in acidic medium | 15 mins |

Example 14

Activity of Different Sols in Basic Medium.

The $TiO_2$ sol (made from isopropoxide route) containing PVA (MW: 15,000) was prepared as follows. PVA (0.10 g, MW:15,000) was diluted in hot de-ionised water (50 ml) then allowed to cool to room temperature. A known amount of concentrated $TiO_2$ sol was added to the PVA solution under vigorous stirring. The volume was completed to 100 ml with de-ionised water. Final TiO2 concentration 1 g/L.

Basic System No PVA.

A mixture of TiO2 sol (isopropoxide route, 10 ml, 1 g/L) and tris(2,2'-dipyridyl-4,4'-dicarboxylate)ruthenium(II) (dichloride) (40 ml, 3.4×$10^{-5}$M) was stirred using a stirrer hotplate. The pH was adjusted by addition of a sodium hydroxide solution (0.1M) to pH 10. Gentian violet (0.08 ml, 0.03 wt/v %) was added to the mixture (volume used: 5 ml).

Basic System with PVA (1).

A mixture of $TiO_2$ sol containing PVA at pH 10.03 (1 ml, 1 g/L) and tris(2,2'-dipyridyl-4,4'-dicarboxylate)ruthenium (II)(dichloride) also at pH 10.1 (4 ml, c=3.4×$10^{-5}$M) was stirred for about 1 minute using a rotamixer. The pH (9.85) was adjusted with a sodium hydroxide solution (0.1M) in order to get pH 10. Gentian violet (0.08 ml, 0.03 wt/v %) was added to the mixture.

Basic System with PVA (2).

A mixture of TiO2 sol containing PVA (10 ml) and tris(2,2'-dipyridyl-4,4'-dicarboxylate)ruthenium(II)(dichloride) (40 ml, c=3.4×$10^{-5}$M) was stirred using a stirrer hotplate. The pH was adjusted with a sodium hydroxide solution (0.1M) to pH 10. Gentian violet (0.08 ml, 0.03 wt/v %) was added to the mixture (volume used: 5 ml).

Millennium Basic System.

A mixture of Millennium $TiO_2$ sol in Basic medium(1 ml, 1 g/L) and tris(2,2'-dipyridyl-4,4'-dicarboxylate)ruthenium (II)dichloride (4 ml, c=3.4×$10^{-5}$M) was stirred for about 1 minute using a rotamixer. The pH was adjusted with a sodium hydroxide solution (0.1 M) to pH 10.

Addition of gentian violet (0.05 ml, 0.03 wt/v %) produced a purple colour in all systems. A UV/Visible spectrum was taken at this stage. The vial containing the mixtures were placed onto an overhead projector (2 cm height from the glass, in order to reduce heat). UV/Visible spectra were used to observe the colour change over a period of time.

The Results are Summarised in table 6.

TABLE 6

Activity of $TiO_2$ sols in basic medium

| $TiO_2$ sol source | Time required to decolourise 0.08 ml of gentian violet | Remarks |
|---|---|---|
| Isopropoxide route no PVA | >4 hours | Only stable for a short period of time. |
| Isopropoxide route with PVA (1) | >4 hours | PVA helped stabilised the system. |
| Isopropoxide route with PVA (2) | >4 hours | PVA helped stabilised the system. |
| Millennium in basic medium | 1 h 10 min | Stable sol. No need to add any surfactant. |

Example 15

A solution containing a TiO2 sol (Millennium TiO2 sol in basic medium, 10 g/L, 5.0 ml), tris(2,2'-bipyridyl4,4'-dicarboxylate)ruthenium(II)(dichloride) (1.8 ml, $3.4\times10^{-5}$M), Igepal® CO-720 (0.18 g) and de-ionised water (3.2 ml) was stirred for few minutes using a rotamixer. The pH was adjusted to 10 by addition of a sodium hydroxide solution (0.1M). The mixture was wrapped into some aluminium foil and left standing overnight to equilibrate. A solution containing a TiO2 sol (Millennium TiO2 sol in basic medium, 10 g/L, 5.0 ml), Igepal® CO-720 (0.18 g) and de-ionised water (5.0 ml) was stirred for few minutes using a rotamixer. The pH was adjusted to 10 by addition of a sodium hydroxide solution (0.1M).

Thin films of these solutions were prepared by spin coating 0.1 ml of these solutions at 100 to 500 rpm on a clean glass microscope slide for 80 seconds. The film was dried using a hot air gun and the process repeated to give a total of 2 coats on the microscope slide. A second slide was then prepared in exactly the same way. All slides were then immersed into a solution of 0.3% Gentian Violet in 20% ethanol for 5 minutes. The slides were removed, rinsed with water to remove any excess stain and allowed to air dry. One slide was kept in total darkness and the second was placed onto an overhead projector (Model Ensign. Lamp: 24V-250 W-3860 lux). The purple colour on the films faded after 3 hours 30 min. There was no change in the colour of the slide stored in darkness.

Example 16

The titania sols have been characterised by TEM (transmission electron microscopy). The samples were prepared by pipetting a few drops of the sol onto holey carbon films. Gold grids were used to avoid support corrosion. The microscope used was a Philips CM20, operated at 200 kV. The results are summarised in Table 7.

TABLE 7

TEM results of different source of titania.

| $TiO_2$ sol source | TEM results |
|---|---|
| Prepared as per example 1 of GB 1412 937 (Woodhead) (peptised at 60° C.) (A) | Irregularly shaped titania crystallites mainly anatase with a size of 10 nm. |
| Prepared as per example 1 of GB 1412 937 (Woodhead) (peptised at room temperature) (B) | Irregularly shaped titania crystallites mainly anatase with a size of 10 nm. |
| Sensitised $TiO_2$ sol* (C) | Irregularly shaped titania crystallites mainly anatase with a size of 10 nm. |
| Isopropoxide route (D) | Sample had to be diluted. The titania crystallites were more tightly packed together. The crystallite size is very small. The particles formed self-supporting films over holes on the carbon film. |
| Millennium sol Basic medium (E) | Titania particles appeared to be much more agglomerated than samples A and C. As a result of this agglomeration, the particles formed self-supporting films over holes on the carbon film. |

*TiO2 sol (Prepared as per example 1 of GB 1412 937 (Woodhead) 10 g/L, 5.0 ml), tris(2,2'-bipyridyl-4,4'-dicarboxylate) ruthenium(II)(dichloride) (1.8 ml, $3.4\times10^{-5}$M) and de-ionised water (3.2 ml)

Example 17

Activity of Stabilised Sensitised Titania Versus Titania Only.

$TiO_2$ Only with PVA.

The $TiO_2$ sol (made from isopropoxide route) containing PVA (MW: 15,000) was prepared as follows. PVA (0.10 g, MW:15,000) was diluted in hot de-ionised water (50 ml) then allowed to cool to room temperature. A known amount of concentrated $TiO_2$ sol was added to the PVA solution under vigorous stirring. The volume was completed to 100 ml with de-ionised water. Final TiO2 concentration 1 g/L.

A mixture of $TiO_2$ sol containing PVA (1 ml, 1 g/L) and de-ionised water (4 ml) was stirred for about 1 minute using a rotamixer. Gentian violet (0.08 ml, 0.03 wt/v %) was added to the mixture.

Sensitised $TiO_2$ with PVA-Acidic Medium.

The $TiO_2$ sol (made from isopropoxide route) containing PVA (MW15,000) was prepared as follows. PVA (0.10 g, MW 15,000) was diluted in hot de-ionised water (50 ml) then allowed to cool to room temperature. A known amount of concentrated $TiO_2$ sol was added to the PVA solution under vigorous stirring. The volume was completed to 100 ml with de-ionised water. Final TiO2 concentration 1 g/L. A mixture of $TiO_2$ sol containing PVA (1 ml, 1 g/L) and tris(2,2'-dipyridyl-4,4'-dicarboxylate)ruthenium(II)(dichloride) (4 ml, $c=4.3\times10^{-5}M$) was stirred for about 1 minute using a rotamixer. Gentian violet (0.08 ml, 0.03 wt/v %) was added to the mixture.

Sensitised $TiO_2$ with PVA-Basic Medium.

A mixture of TiO2 sol containing PVA (10 ml) and tris(2,2'-dipyridyl-4,4'-dicarboxylate)ruthenium(II)(dichloride) (40 ml, $c=3.4\times10^{-5}M$) was stirred using a stirrer hotplate. The pH was adjusted with a sodium hydroxide solution (0.1M) to pH 10. Gentian violet (0.08 ml, 0.03 wt/v %) was added to the mixture (volume used: 5 ml).

A UV/Visible spectrum is taken at this stage. The vials containing the mixtures were placed onto an overhead projector (2 cm height from the glass, in order to reduce heat). UV/Visible spectra were used to observe the colour change over a period of time. TiO2 without dye has significantly slower photocatalytic activity when compared with sensitised $TiO_2$

Example 18

Breakdown of 4-chlorophenol (halogenated pollutant) using TiO2.

A microscope slide containing a thin film of sensitised $TiO_2$ was added into a solution of 4-chlorophenol (99+%, Aldrich, 8 ml, $10^{-4}M$). The vial containing the solution and the slide was placed onto an overhead projector. The degradation of 4-chlorophenol was monitored using UV/Visible analysis. A spectrum was taken over a period of time at max of the 4-chlorophenol (=280 nm).

The absorbance at 280 nm was decreasing over time.

Example 19

Demonstration of the Photocatalytic Nature of TiO2 in Addition to Sensitiser

A mixture of $TiO_2$ sol (5 ml, 10 g/L), tris(2,2'-dipyridyl-4,4'-dicarboxylate)ruthenium(II)(dichloride) (1.8 ml, $3.4\times10^{-5}M$) and de-ionised water (3.2 ml) was stirred for about 1 minute using a rotamixer. Half of the volume of the mixture was used for testing. A target dye, gentian violet (0.08 ml, 0.03 wt/v %) was added to the mixture producing a blue-purple colour. A UV/Visible spectrum was taken. The vial containing the mixture was placed onto an overhead projector (2 cm height from the glass in order to reduce heat). A UV/Visible spectrum was taken over a period of time in order to observe the colour change. Once the spectrum showed no trace of target dye, the same amount of gentian violet was added to the same mixture. The all process was repeated twice. The target dye gentian violet was still decolourising on the third addition but at a slower rate than on the first addition.

Example 20

Zinc oxide was prepared according to the method outlined by Bahnemann et al, J. Phys. Chem., (1987), 91, 3789. The oxide suspension (made by stirring the ZnO solid into a sodium hydroxide solution at pH9) was then sensitised with 4,4'-dicarboxa late,tris(2,2'bibyridyl)Ru(II)dichloride according to the method outlined in previous examples. Gentian violet dye was added to both the sensitised sample and the non-sensitised control sample, and the UV/visible spectrum was recorded as a function of time under illumination with white light (5,000 lux). The results demonstrate that the absorption peak associated with Gentian Violet decreases faster with the sensitised ZnO compared to the control.

Example 21

The methods described below offer general synthetic pathways to sensitising agents specifically designed to function in combination with semiconductors where the desired operating condition is such that the un-coated semiconductor surface presents a significant number of adsorption sites with a negative charge. Typical positively charged groups for use as binding sites include, but are not limited to $R_4N+$ groups and $R_4P+$ groups, where R is as hereinbefore described Novel Dyes Based on Terpyridyl Terpyridyl-based sensitisers with phosphonate chelating ligands (Graetzel at al, WO 95/29924) and with other ligand types (Graetzel et al, WO 94/0449) have been used in conjunction with titania in dye-sensitised solar cells. The terpyridyl group of general formula I can be synthesised with e.g. R1 as a positively charged unit. One example where R5-7 of formula II are methyl, is synthesised according to procedures where the intermediate is made by the method outlined in Recl. Trav. Chim. Pays. Bas, 1959, v78, 408. This nitrated aryl group is then changed into the terpyridyl unit by the method outlined by McWhinne et al (J Organoetallic chem., 1968, v11, 499). The nitro group is then reduced to the amine by hydrazine hydrate under Pd/C catalysis followed by reaction with excess methyl iodide to form the quaternary nitrogen terpyridyl ligand desired.

Yet another variant of the positively charged terpyridyl molecule [described by general formula I] can be synthesised by reacting 2-acetylpyridine with 4-nitrobenzaldehyde in base followed by ring closure with ammonium acetate according to methods outlined by E Constable et al (J Chem Soc Dalton Trans, 1992, 2947), followed by reduction of the nitro group to the amine and quaternisation as described previously to form a compound described by formula I with R2 and R 3 as hydrogen and R1 as

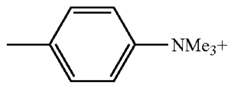

Yet another general preparative method for a terpyridal group of general formula I is based on derivatising the structure below (Potts et al, JACS 1987, v109, 3961) by oxidising it to the carboxylic acid by e.g. the methodology outlined by Dodd et al (Synthesis (1993), V3, 295). Amination of the carboxylate is then carried out by standard procedures outlined in e.g. Chem Rev. (1981) V81, p589.

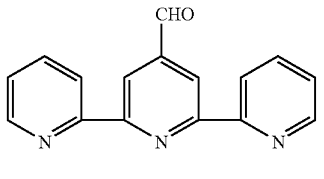

Bipyridyls

The synthesis of a compound of general formula III with R8,9=NH2 is described in (JACS 1958, V80, 2745) and (J Chem Soc Perkin Trans 2, 1996, 613) and a compound of formula III can be quarternised by the preceding methods outlined for terpyridyls.

Phthalocyanines

Phthalocyanine dyes can be synthesised with amine nitrogen groups by e.g. Buchwald ammination of halide precursors to produce outer-ring derivatives such as (J Org Chem 2000, V65, 1158), the amine groups of which are then quarternised.

Tetra-aza-annulenes (TADAs)

TADAs of the general formula V can be derivatised at R1, R2, R3, and R4 by the general methods outlined above.

Dimers

The bipyridyl compounds tris(2,2'-bipyridyl-4,4'-dicarboxylate)ruthenium(II)dichloride and tris(2,2'-bipridyl)ruthenium (II) dichloride can be dimerised using pyrazine derivatives such as pyrazine, pyrimidine and 4,4'-bipyridyl linking ligands according to procedures detailed in (E A Seddon & K R Seddon, The Chemistry of Ruthenium, Elsevier, New York 1984, p 436).

The invention claimed is:

1. A method of cleaning a surface comprising cleaning the surface by: (1) coating said surface with a composition comprising a photocatalyst selected from the group consisting of titania and zinc oxide and a ruthenium bi- or ter-pyridyl or phenanthroline-based sensitizer, and (2) exposing the surface to visible or infra-red light.

2. A method according to claim 1, wherein the sensitizer used comprises a terpyridyl group of general formula I:

(I)

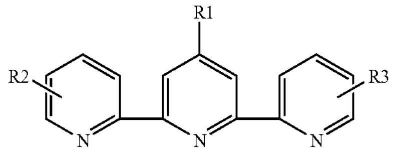

wherein at least one of R1, R2 and R3 are positively charged groups which has the general formula II shown below:

(II)

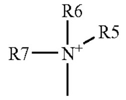

wherein R5-R7 are any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted.

3. A method according to claim 2, wherein the sensitizer used includes a bipyridyl group of the general formula III:

(III)

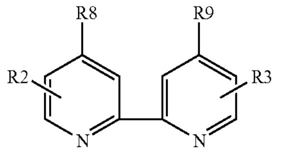

wherein R8 and R9 can be the same or different and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted, R2 may be the same or different from R3 and is any one or more of the following groups: hydrogen, halogen, amine, alkyl, aryl, arylalkyl, alkoxy, heterocyclic groups, or derivatives thereof, including acid and ester derivatives, any of which may be branched or unbranched, substituted or unsubstituted.

4. A method according to claim 3 wherein the sensitiser is selected from the group consisting of tris (2,2'-dipyridyl-4, 4'dicarboxylate) ruthenium (II) and tris (2,2'-dipyridyl) dichlororuthenium (II) and their dimers.

5. A method according to claim 4, wherein the sensitiser is tris (2,2'-dipyridyl-4,4'-dicarboxylate) ruthenium (II) (dichloride).

6. A method according to claim 1, wherein the photocatalyst is selected from the group consisting of a nanocrystalline titanium dioxide sol and zinc oxide sol.

7. A method according to claim 1, wherein the composition is in the form of an acidic liquid suspension or sol having a pH less than 7.

8. A method according to claim 7, wherein the composition has a pH less than 5.

9. A method according to claim 1, wherein the composition is in the form of a liquid suspension or sol, having a pH of 7 or more.

10. A method according to claim 9, wherein the composition is in the form of a liquid suspension or sol, having a pH of 9 or more.

11. A method according to claim 1, wherein the composition further comprises a doping agent.

12. A method according to claim 1, wherein the photocatalyst comprises no more than 1% w/v of the composition.

13. A method according to claim 1, wherein the photocatalyst comprises no more than 0.1% w/v of the composition.

14. A method according to claim 1, wherein the sensitiser is present in an amount no more than 0.1% w/v of the composition.

15. A method of cleaning a surface comprising cleaning the surface by depositing a dry functional residue on a surface, said residue deposited from a composition, said composition comprising a photocatalyst selected from titania and zinc oxide, wherein the photocatalyst is sensitised by a ruthenium bi- or ter-pyridyl or phenanthroline-based sensitiser and said sensitiser causes activation by visible or infra-red light.

* * * * *